(12) United States Patent
Wentzlik

(10) Patent No.: US 12,193,203 B2
(45) Date of Patent: Jan. 7, 2025

(54) DAMPING FILM AND PROCESS FOR PRODUCING A DAMPING FILM

(71) Applicant: Magnetec GmbH, Hanau (DE)

(72) Inventor: Thomas Wentzlik, Frankfurt Main (DE)

(73) Assignee: Magnetec GmbH, Hanau (DE)

( * ) Notice: Subject to any disclaimer, the term of this patent is extended or adjusted under 35 U.S.C. 154(b) by 0 days.

(21) Appl. No.: 18/288,232

(22) PCT Filed: Apr. 29, 2022

(86) PCT No.: PCT/EP2022/061497
§ 371 (c)(1),
(2) Date: Oct. 25, 2023

(87) PCT Pub. No.: WO2022/229393
PCT Pub. Date: Nov. 3, 2022

(65) Prior Publication Data
US 2024/0244809 A1 Jul. 18, 2024

(30) Foreign Application Priority Data
Apr. 30, 2021 (DE) .......................... 102021111286.9

(51) Int. Cl.
*H05K 9/00* (2006.01)

(52) U.S. Cl.
CPC ......... *H05K 9/0086* (2013.01); *H05K 9/0075* (2013.01)

(58) Field of Classification Search
CPC ........................... H05K 9/0075; H05K 9/0086
See application file for complete search history.

(56) References Cited

U.S. PATENT DOCUMENTS

| | | | |
|---|---|---|---|
| 2011/0210696 A1 | 9/2011 | Inoue | |
| 2013/0306364 A1* | 11/2013 | Suzuki | H05K 9/0088 174/394 |

(Continued)

FOREIGN PATENT DOCUMENTS

| | | |
|---|---|---|
| CN | 103969488 A | 8/2014 |
| CN | 104011814 A | 8/2014 |

(Continued)

OTHER PUBLICATIONS

International Preliminary Report on Patentability in PCT/EP2022/061497, dated Jul. 24, 2023.

(Continued)

*Primary Examiner* — Hoa C Nguyen
*Assistant Examiner* — Amol H Patel
(74) *Attorney, Agent, or Firm* — Occhiuti & Rohlicek LLP

(57) ABSTRACT

A damping film for shielding an electronic device from an electrical and/or magnetic field, in particular damping film for shielding an electronic device having components for wireless charging from an electrical and/or magnetic field, comprising a first carrier layer, a first adhesion layer which is in direct contact with the first carrier layer, a damping layer which is in direct contact with the first adhesion layer, wherein the damping layer comprises a damping material consisting of a magnetically soft substance, a second adhesion layer which is in direct contact with the damping layer, in particular is in direct contact with the damping layer on the side facing away from the first adhesion layer, and a second carrier layer which is in direct contact with the second adhesion layer.

22 Claims, 3 Drawing Sheets

(56) References Cited

U.S. PATENT DOCUMENTS

Figure 1:
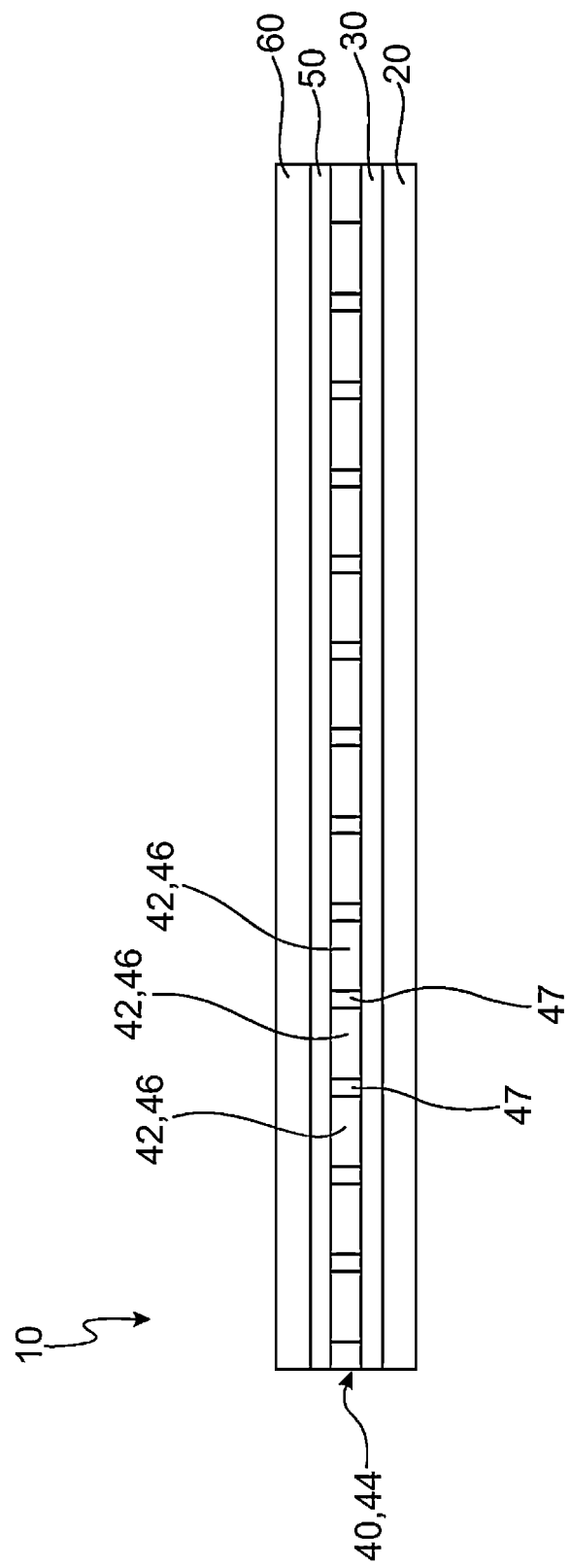

2021/0005371 A1* 1/2021 Kim .................. H01F 10/08
2021/0241956 A1* 8/2021 Jang .................. H01F 38/14

FOREIGN PATENT DOCUMENTS

| | | |
|---|---|---|
| CN | 109152317 A | 1/2019 |
| CN | 111698898 A | 9/2020 |
| DE | 202005022087 U1 | 6/2013 |
| DE | 102012109744 A1 | 4/2014 |
| DE | 102013103268 A1 | 10/2014 |
| EP | 1051714 B1 | 12/2001 |
| EP | 2797092 B1 | 2/2017 |
| WO | 2010140367 A1 | 12/2010 |
| WO | 2015147449 A1 | 10/2015 |
| WO | 2018004262 A1 | 1/2018 |
| WO | 2019034953 A1 | 2/2019 |

OTHER PUBLICATIONS

Boll R Ed, Weichmagnetische Werkstoffe:, Jan. 1, 1990, Weichmagnetishce Wekstoffe. Einfuhring in Den Magnetismus VAC-Wekstoffe Und Ihre Anwendungen, Hanau, Vacuumschmelze GmbH, DE, pp. 171-174, XP002102087, ISBN: 978-3-8009-1546-0.
International Search Report, PCT Application No. PCT/EP2022/061497, mailed Aug. 30, 2022 (5 pages).

* cited by examiner

DAMPING FILM AND PROCESS FOR PRODUCING A DAMPING FILM

CROSS REFERENCE TO RELATED APPLICATIONS

This application is a national phase under 35 USC 371 of International Application No. PCT/EP2022/061497, filed Apr. 29, 2022, which claims the benefit of the filing date of German Application No. 10 2021 111 286.9, filed Apr. 30, 2021, the contents of all of which are hereby incorporated by reference in their entireties.

The invention relates to a damping film and to a process for producing a damping film.

The invention relates in particular to a damping film, to an item having a battery, a receiver coil for wirelessly receiving energy, and a damping film, to an item having a transmitter coil for wirelessly transmitting energy to a receiver coil, and a damping film, to a process for producing a damping film and to a use of a damping film.

A wireless charging method is used to charge a battery of a mobile device without the mobile device being connected to a power source by means of a mechanical connection such as a cable and/or a connector.

During wireless charging, the energy is transmitted by means of an electromagnetic field from a transmitter coil to a receiver coil. However, said electromagnetic field can influence not only the receiver coil, but also other electronic devices and further components, which can result in unwanted reactions and damage.

A damping film can be used to damp the propagation of the electromagnetic field, so that an effect of the electromagnetic field on other electronic devices and further components can be reduced or prevented.

The object of the invention is that of providing an improvement over or an alternative to the prior art.

According to a first aspect of the invention, the object is achieved by a damping film, in particular a damping film for shielding an electronic device from an electrical and/or magnetic field, in particular damping film for shielding an electronic device having components for wireless charging from an electrical and/or magnetic field, comprising:
  a first carrier layer;
  a first adhesion layer which is in direct contact with the first carrier layer;
  a damping layer which is in direct contact with the first adhesion layer, wherein the damping layer comprises a damping material consisting of a magnetically soft substance;
  a second adhesion layer which is in direct contact with the damping layer, in particular is in direct contact with the damping layer on the side facing away from the first adhesion layer; and
  a second carrier layer which is in direct contact with the second adhesion layer.

In this regard, the following is explained conceptually:

It should first be expressly noted that in the context of the present patent application, indefinite articles and numbers such as "one," "two," etc. should generally be understood as "at least" statements, i.e. as "at least one . . . ," "at least two . . . ," etc., unless it is clear from the relevant context or it is obvious or technically imperative to a person skilled in the art that only "exactly one . . . ," "exactly two . . . ," etc. can be meant.

In the context of the present patent application, the expression "in particular" should always be understood as introducing an optional, preferred feature. The expression should not be understood to mean "specifically" or "namely."

A "damping film" is understood to mean a composite film comprising a plurality of layers connected to each other at least in pairs, which is designed to damp an electrical and/or magnetic field with regard to its propagation, so that, starting from a source of an electrical and/or magnetic field, electronic devices arranged behind the damping film can be shielded from the electrical and/or magnetic field. In this way, the action of an electrical and/or magnetic field on electronic devices and/or components protected by the damping film can be greatly reduced or prevented.

"Damping" is understood to mean that the power of an electrical and/or magnetic field decreases, in particular the electrical power and/or the magnetic power.

A "carrier layer" is understood to mean a structure-forming layer in the layer composite of the damping film which is designed to impart a higher tensile strength and/or compressive strength to an adjoining, comparatively soft adhesion layer and/or the indirectly adjacent damping layer having a comparatively brittle damping material in the layer composite. As a result, a comparatively elastic and thus flexible shielding film can be achieved, which can be wrapped around electronic devices and/or different components to be shielded, cut in almost any shapes, and adapted to the shape of an electronic device and/or other component to be shielded.

Likewise, with a carrier layer it is possible to advantageously prevent the shielding film as a material composite from overall having brittle material properties, even if the damping layer individually has brittle material properties. In addition, the shear strength of the damping film can also be optimized by means of a correspondingly selected carrier layer.

Preferably, a carrier layer shall be understood to mean a plastic film and/or a woven layer.

An "adhesion layer" is understood to mean a layer of an adhesion material, in particular a layer made of an adhesive, which is designed to connect two layers adjoining the adhesion layer to each other.

A "damping layer" is understood to mean a layer within the damping film which has a damping material.

A "damping material" is preferably understood to mean a magnetically soft substance having a permeability of more than or equal to 500 H/m.

Preferably, a damping material has low eddy current losses, whereby the quality of the shielding effect originating from the damping material can be advantageously increased. Particularly in the case of high-frequency electrical and/or magnetic fields, low eddy current losses of the damping material result in an advantageous damping effect.

Among other things, due to low eddy current losses of the damping material it can advantageously be achieved that the damping film does not heat up strongly or maintains its temperature or that its temperature rises only slightly.

Furthermore, the comparatively high permeability of a magnetically soft substance allows an electrical field acting on the magnetically soft material to be converted particularly efficiently into a magnetic field, and vice versa. In this way, the electrical field and the magnetic field can exchange their energy particularly efficiently, which particularly supports the damping effect.

A "magnetically soft substance" is understood to mean a substance which can easily be magnetized in a magnetic field. Preferably, a magnetically soft substance has a coercivity of less than 1000 A/m.

"Coercivity" is understood to mean the magnetic field strength which is necessary to completely demagnetize a damping material charged beforehand up to saturation flux density.

Preferably, a magnetically soft substance, in particular an amorphous magnetically soft substance, has an alloy comprising iron, nickel and/or cobalt.

A damping film is proposed herein which has a composite of several material layers. In this case, in particular the damping layer having a magnetically soft substance as damping material has a damping effect on an electrical and/or magnetic field.

By combining several different material layers to form a damping film and/or as a result of the material selection for the respective layers, it is possible to advantageously optimize the properties of the damping film. As a result, a damping film can be achieved, which is at the same time elastic and cuttable and furthermore allows for particularly efficient damping of an electrical and/or magnetic field.

First carrier layer and first adhesion layer may be understood to mean, inter alia, an adhesive strip which already provides a composite of first carrier layer and first adhesion layer. This idea can be applied analogously also to the second carrier layer and the second adhesion layer.

In particular, the combination of the damping film from a first carrier layer connected to the damping layer and the second carrier layer connected to the damping layer advantageously makes it possible for the damping film proposed herein to show particularly good cuttability, so that it can be adapted in a geometrically exact manner to the designated conditions of use. Tests have surprisingly shown that cuttability has considerably improved due to the combination of first carrier layer, damping layer and second carrier layer; it is possible, in particular, to thereby achieve considerably smoother cutting edges even with complex cutting lines.

Expediently, the damping material of the damping layer projecting in the normal direction of the first carrier layer has a cross-sectional area of more than or equal to 80% of the cross-sectional area of the first carrier layer, preferably of more than or equal to 87.5%, and particularly preferably of more than or equal to 92.5%.

Further expediently, the damping material of the damping layer projecting in the normal direction of the first carrier layer has a cross-sectional area of more than or equal to 95% of the cross-sectional area of the first carrier layer, preferably of more than or equal to 97.5%, and particularly preferably of more than or equal to 99%.

It is proposed herein for the damping layer to not have the damping material over its entire surface, but rather for the damping layer to have the damping material only on part of its surface, in a plan view of the damping film.

The idea here is, among other things, for the damping material to be provided in strips which are oriented parallel to each other and each have a distance from each other.

Furthermore, the idea is specifically for the damping material to be designed as particulate material and for the particles to be arranged such as to be distributed relative to each other in the damping layer.

It shall be expressly noted that a damping layer can also have strips and/or particles of the damping material, wherein the particles and/or the strips are arranged differently relative to each other without departing from this aspect.

The damping layer preferably comprises a layer of several strips of the damping material.

In this regard, the following is explained conceptually:

A "layer" is understood to mean an arrangement of strips comprising the damping material, which are arranged in an ordered manner relative to each other, preferably arranged parallel to each other, wherein the strips either do not overlap at all or overlap only slightly. In other words, the strips are arranged within one layer in only one plane, wherein a slight overlap of the strips at their abutting edges remains enabled.

A "strip" of the damping material is understood to mean a thin film or a thin band with a maximum thickness of 50 µm.

Preferably, a strip has a thickness of less than or equal to 40 µm, preferably a thickness of less than or equal to 30 µm, and particularly preferably a thickness of less than or equal to 25 µm. Further preferably, a strip has a thickness of less than or equal to 20 µm, preferably a thickness of less than or equal to 15 µm, and particularly preferably a thickness of less than or equal to 12 µm.

Preferably, a strip has a width of less than or equal to 30 mm, preferably a width of less than or equal to 25 mm, and particularly preferably a width of less than or equal to 20 mm. Further preferably, a strip has a width of less than or equal to 15 mm, preferably a width of less than or equal to 12.5 mm, and particularly preferably a width of less than or equal to 10 mm.

A damping film with a damping layer is proposed herein, wherein the damping layer comprises a layer of several strips of the damping material, in particular comprises exactly one layer of several strips of the damping material.

The quality of damping can advantageously be further increased by the arrangement of several strips in one layer instead of a continuous film made of a magnetically soft substance.

It shall be expressly noted that the above values for the thickness and/or width of a strip should not be understood as strict limits; rather, it should be possible to exceed or fall below them on an engineering scale without departing from the described aspect of the invention. In simple terms, the values should provide an indication of the size of the thickness and/or width of a strip proposed herein.

According to an expedient embodiment, two strips of the damping material have a distance of less than or equal to 0.2 mm from each other, preferably a distance of less than or equal to 0.1 mm, and particularly preferably a distance of less than or equal to 0.05 mm.

The eddy currents in the damping layer can be spatially restricted by separate strips, and a domain refinement results. In addition, the magnetically soft properties are isotropic due to the differentiable hysteresis loop so that magnetic fields from different directions can be shielded.

Further preferably, two strips of the damping material adjoin each other directly, in particular two adjacent strips of the damping material adjoin each other directly over their entire longitudinal extension.

It shall be expressly noted that the above values for the distance should not be understood as strict limits; rather, it should be possible to exceed or fall below them on an engineering scale without departing from the described aspect of the invention. In simple terms, the values are intended to provide an indication of the size of the distance proposed herein.

According to an alternative embodiment, two strips of the damping material overlap by more than or equal to 0.2 mm, preferably by less than 0.2 mm, and particularly preferably by less than or equal to 0.1 mm, in particular over their entire longitudinal extension.

The arrangement of the overlapping strips of the damping film can advantageously result in that the flux conduction from strip to strip can be improved, thereby increasing the shielding performance.

It shall be expressly noted that the above values for the overlap should not be understood as strict limits; rather, it should be possible to exceed or fall below them on an engineering scale without departing from the described aspect of the invention. In simple terms, the values are intended to provide an indication of the magnitude of the overlap proposed herein.

According to a particularly preferred embodiment, the damping layer comprises particles of the damping material.

In this regard, the following is explained conceptually:

A "particle" is understood to mean a body which is small compared to the damping film. Preferably, a particle is understood to mean a body which in each spatial direction has an extension in a range between 3 μm and 200 μm.

What is meant herein is a damping layer comprising particles of the magnetically soft substance.

Preferably, the particles are arranged such as to be distributed relative to each other in the damping layer.

Further preferably, the damping layer consisting of particles of a magnetically soft substance has a thickness of greater than or equal to 10 μm and less than or equal to 40 μm.

Specifically, the idea is also for the particles to be bonded in the damping layer by means of a matrix material.

A "matrix material" is understood to mean a material in which the particles of the magnetically soft substance can be dissolved.

Dissolving the particles of the magnetically soft substance in the matrix material is understood to mean that the particles, while maintaining their material composition, are or have been converted into a mixture which is largely homogeneous, in the technical sense of that term, and comprises, in addition to the particles, at least one solvent for the particles, in particular at least the matrix material. The idea is for the solvent to surround the particles, and for the particles to be bonded to the solvent by adhesive interactions.

The solvent preferably also has a filler in addition to the matrix material.

The matrix material is preferably meant to be a liquid substance, in particular a liquid substance with a dilatant or Newtonian or pseudoplastic or Bingham-plastic or Casson-plastic flow behavior.

According to an optional embodiment, the matrix material is cured after dissolution of the particles, in particular by a reaction between the matrix material and a hardener. Among other things, it is also intended for the damping film to be fixed in shape after application using UV light by curing the matrix material of the damping layer by means of the UV light.

Expediently, the particles have an extension in a range of greater than or equal to 3 μm and less than or equal to 200 μm, preferably an extension in a range of greater than or equal to 4 μm and less than or equal to 100 μm, and particularly preferably an extension in a range of greater than or equal to 5 μm and less than or equal to 50 μm.

Further preferably, the particles have an extension in a range of greater than or equal to 7 μm and less than or equal to 40 μm, preferably an extension in a range of greater than or equal to 8 μm and less than or equal to 30 μm, and particularly preferably an extension in a range of greater than or equal to 10 μm and less than or equal to 20 μm.

It should be understood that the above range limits can also be combined with each other as desired without departing from this aspect of the invention.

Optionally, the damping film has a third adhesion layer, preferably a third adhesion layer in direct contact with the first carrier layer on the side facing away from the first adhesion layer.

As a result of the third adhesion layer, it can advantageously be achieved that the damping film can be fixed at its designated place of use like an adhesive strip.

A first carrier layer comprising a first adhesion layer and a third adhesion layer may be understood to mean, inter alia, a double-sided adhesive tape.

According to an expedient embodiment, the first carrier layer and/or the second carrier layer and/or the first adhesion layer and/or the second adhesion layer and/or the third adhesion layer has a temperature resistance of more than or equal to 80° C., preferably of more than or equal to 100° C., and particularly preferably of more than or equal to 120° C.

Further expediently, the first carrier layer and/or the second carrier layer and/or the first adhesion layer and/or the second adhesion layer and/or the third adhesion layer has a temperature resistance of more than or equal to 150° C., preferably of more than or equal to 170° C., and particularly preferably of more than or equal to 200° C.

The damping material can heat up due to the damping of an electrical and/or magnetic field. This resulting heat can migrate to an adhesion layer and/or a carrier layer. In case of too low a temperature resistance, the damping film may thus shift and/or come off and/or be damaged. This is thwarted by the temperature resistance proposed herein.

Furthermore, the idea is also for the damping film proposed herein to be usable in places which may have a higher temperature. This can be achieved by the temperature resistance of the damping film proposed herein.

It shall be expressly noted that the above values for the temperature resistance should not be understood as strict limits; rather, it should be possible to exceed or fall below them on an engineering scale without departing from the described aspect of the invention. In simple terms, the values are intended to provide an indication of the magnitude of the temperature resistance proposed herein.

The damping material preferably has a coercivity of less than or equal to 10 A/m, preferably a coercivity of less than or equal to 5 A/m, and particularly preferably a coercivity of less than or equal to 3 A/m.

Preferably, the damping material has a coercivity of less than or equal to 2 A/m, preferably a coercivity of less than or equal to 1.5 A/m, and particularly preferably a coercivity of less than or equal to 1 A/m. Further preferably, the damping material has a coercivity of less than or equal to 0.5 A/m, preferably a coercivity of less than or equal to 0.1 A/m, and particularly preferably a coercivity of less than or equal to 0.05 A/m.

The above-mentioned values for coercivity apply to a magnetic field oscillating at 50 Hz.

Due to low coercivity of the damping material, dissipation in the damping material can be reduced, in particular in the case of designated applications with polarity-changing field strengths, which can additionally increase thermal stability.

It shall be expressly noted that the above values for the coercivity should not be understood as strict limits; rather, it should be possible to exceed or fall below them on an engineering scale without departing from the described aspect of the invention. In simple terms, the values are intended to provide an indication of the magnitude of the damping material's coercivity proposed herein.

Further preferably, the damping material has a remanence of less than or equal to 0.1 T, preferably a remanence of less than or equal to 0.05 T, and particularly preferably a remanence of less than or equal to 0.02 T.

As a result, the dissipation occurring in the damping material at polarity-changing field strengths can be additionally advantageously reduced.

The damping material preferably has a saturation flux density of greater than or equal to 1 T, preferably a saturation flux density of greater than or equal to 1.1 T, and particularly preferably a saturation flux density of greater than or equal to 1.2 T. Preferably, the damping material has a magnetic saturation flux density of greater than or equal to 1.3 T.

With increasing saturation flux density, it can be advantageously achieved that the damping material can have smaller dimensions for a reference application without becoming thermally unstable, in particular since a high saturation field strength can be achieved concomitant with the high saturation flux density. In other words, a comparatively high saturation flux density allows heating of the damping material to be reduced or prevented.

It shall be expressly noted that the above values for the magnetic saturation flux density of the damping material should not be understood as strict limits; rather, it should be possible to exceed or fall below them on an engineering scale without departing from the described aspect of the invention. In simple terms, the values are intended to provide an indication of the magnitude of the damping material's magnetic saturation flux density proposed herein.

Particularly expediently, the magnetically soft substance is a metallic glass.

In this regard, the following is explained conceptually:

A "metallic glass" is understood to mean a metal-based alloy of a substance which does not have a crystalline but an amorphous structure on an atomic level, and nevertheless has metallic conductivity as a property. Preferably, a metallic glass may also have non-metallic alloy components in addition to metallic alloy components.

Due to the amorphous atomic arrangement which is very unusual for metals advantageously allows for particular physical substance properties. In particular, coercivity of the damping material can be advantageously reduced and/or permeability can be advantageously increased by using metallic glasses. In addition, metallic glasses can have a high electrical resistance, as a result of which the eddy current losses caused by the damping film can be advantageously reduced for some applications of the damping element.

Particularly preferably, the magnetically soft substance has a nanocrystalline structure.

In this regard, the following is explained conceptually:

A material with a "nanocrystalline structure" is understood to mean a polycrystalline solid with a nano-microstructure, wherein microstructure is understood to mean the type, the crystal structure, the number, the shape and the topological arrangement of point defects, dislocations, stack errors and crystal boundaries in a crystalline material.

The physical properties of the damping element can be further improved by the nanocrystalline structure. In particular, permeability of the magnetically soft substance can be increased.

Preferably, a nanocrystalline material is produced from an amorphous material, wherein the crystal growth is stimulated starting from the amorphous material by the action of a thermal and/or magnetic action.

Preferably, the damping material consists of a magnetically soft substance with a nanocrystalline structure having a typical grain size in the range of 5 μm to 30 μm, preferably of a nanocrystalline magnetically soft substance with a typical grain size in the range of 7 μm to 20 μm, particularly preferably of a nanocrystalline magnetically soft substance with a typical grain size in the range of 8 μm to 15 μm. In this way, particularly advantageous physical properties for the damping material can be achieved, in particular with regard to permeability and/or saturation field strength.

According to a preferred embodiment, the magnetically soft substance has the following atomic composition:

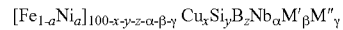

$$[Fe_{1-a}Ni_a]_{100-x-y-z-\alpha-\beta-\gamma}Cu_xSi_yB_zNb_\alpha M'_\beta M''_\gamma$$

where $a \leq 0.3$, $0.6 \leq x \leq 1.5$, $10 \leq y \leq 17$, $5 \leq z \leq 14$, $2 \leq \alpha \leq 6$, $\beta \leq 7$, and $\gamma \leq 8$, wherein M' is at least one of the elements V, Cr, Co, Al and Zn, wherein M" is at least one of the elements C, Ge, P, Ga, Sb, In and Be.

Laboratory tests have shown that the above specification of the magnetically soft substance results in particularly advantageous material properties for the damping material proposed herein.

In particular, a damping material with a particularly small coercive field strength and/or a particularly high saturation flux density can be achieved by the above substance specification.

Preferably, the magnetically soft substance specified above has nickel, in particular a nickel content of greater than or equal to 4.5 wt %, preferably a nickel content of greater than or equal to 5 wt %, and particularly preferably a nickel content of greater than or equal to 5.5 wt %.

The magnetically soft substance expediently has a magnetostriction with a relative change in length in terms of magnitude parallel to the magnetic field of less than or equal to 2 times $10^{-6}$, preferably of less than or equal to 1 times $10^{-6}$, and particularly preferably of less than or equal to 0.5 times $10^{-6}$.

In this regard, the following is explained conceptually:

"Magnetostriction" is understood to mean the deformation of the damping material as a result of an acting magnetic field. In this case, the damping material experiences an elastic change in length at a constant volume.

According to a second aspect of the invention, the object is achieved by an item comprising a battery, a receiver coil for wirelessly receiving energy, and a damping film according to the first aspect of the invention.

It should be understood that the advantages of a damping film according to the first aspect of the invention, as described above, extend directly to an item comprising a battery, a receiver coil for wirelessly receiving energy, and a damping film according to the first aspect of the invention.

The damping film is preferably disposed between the battery and the receiver coil.

As a result, the battery can advantageously be protected by the damping film from the action of an electrical and/or magnetic field.

It should be expressly noted that the subject matter of the second aspect can advantageously be combined with the subject matter of the preceding aspect of the invention, both individually or cumulatively in any combination.

According to a third aspect of the invention, the object is achieved by an item comprising a transmitter coil for wirelessly transmitting energy to a receiver coil, and a damping film according to the first aspect of the invention.

It should be understood that the advantages of a damping film according to the first aspect of the invention, as described above, extend directly to an item comprising a transmitter coil for wirelessly transmitting energy to a receiver coil, and a damping film according to the first aspect of the invention. The damping film is preferably disposed on the transmitter coil.

It should be expressly noted that the subject matter of the third aspect can advantageously be combined with the subject matter of the preceding aspects of the invention, both individually and cumulatively in any combination.

According to a fourth aspect of the invention, the object is achieved by a process for producing a damping film, comprising the following:
- providing a first carrier layer and a first adhesion layer;
- optionally contacting the first carrier layer and the first adhesion layer;
- providing a damping material consisting of a magnetically soft substance;
- contacting the damping material with the first adhesion layer to form a damping layer connected to the first carrier layer;
- providing a second adhesion layer and a second carrier layer;
- optionally contacting the second carrier layer and the second adhesion layer; and
- contacting the second adhesion layer with the damping layer to form a damping film according to the first aspect of the invention.

It should be understood that the advantages of a damping film according to the first aspect of the invention, as described above, extend directly to a process for producing a damping film according to the first aspect of the invention.

Preferably, the idea is for the damping material to be sprayed in particle form onto an adhesion layer, in particular onto an adhesive film.

It should be expressly noted that the subject matter of the fourth aspect can advantageously be combined with the subject matter of the preceding aspects of the invention, both individually and cumulatively in any combination.

According to a fifth aspect of the invention, the object is achieved by a use of a damping film according to the first aspect of the invention in an item having components for wireless charging.

It should be understood that the advantages of a damping film according to the first aspect of the invention, as described above, extend directly to a use of a damping film according to the first aspect of the invention in an item having components for wireless charging.

It should be expressly noted that the subject matter of the fifth aspect can advantageously be combined with the subject matter of the preceding aspects of the invention, both individually and cumulatively in any combination.

According to a sixth aspect of the invention, the object is achieved by a use of a damping film according to the first aspect of the invention in an item having components to be shielded, in particular electronic components, cables and/or sensors.

It should be understood that the advantages of a damping film according to the first aspect of the invention, as described above, extend are directly to a use of a damping film according to the first aspect of the invention in an item having components to be shielded, in particular electronic components, cables and/or sensors.

It should be expressly noted that the subject matter of the sixth aspect can advantageously be combined with the subject matter of the preceding aspects of the invention, both individually and cumulatively in any combination.

Figure 2:
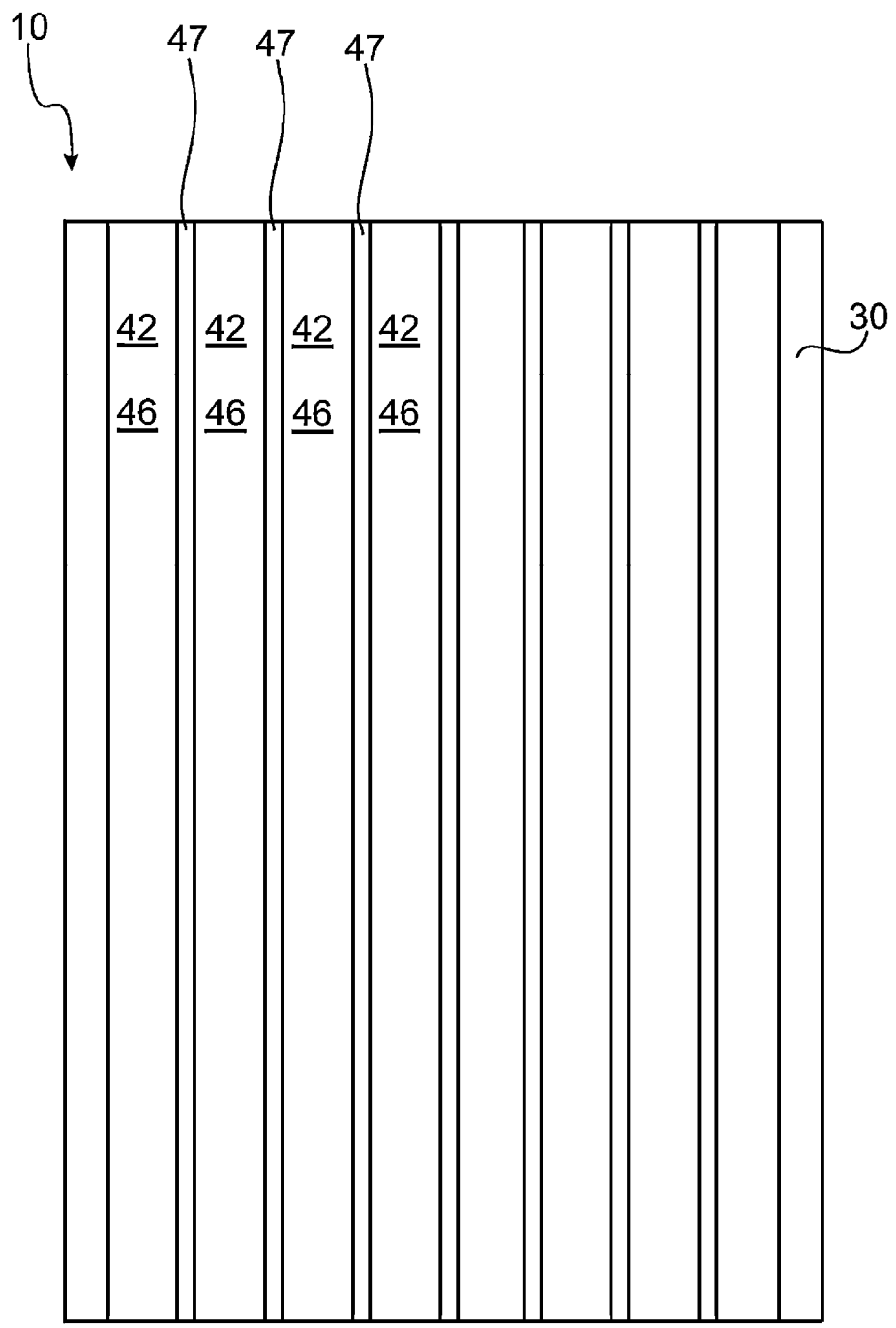

Further advantages, details and features of the invention can be found below in the described embodiments. The figures schematically show the following, in detail:

FIG. 1: a damping film according to a first embodiment in cross section;

FIG. 2: a damping film according to a first embodiment in a sectional view; and

Figure 3:
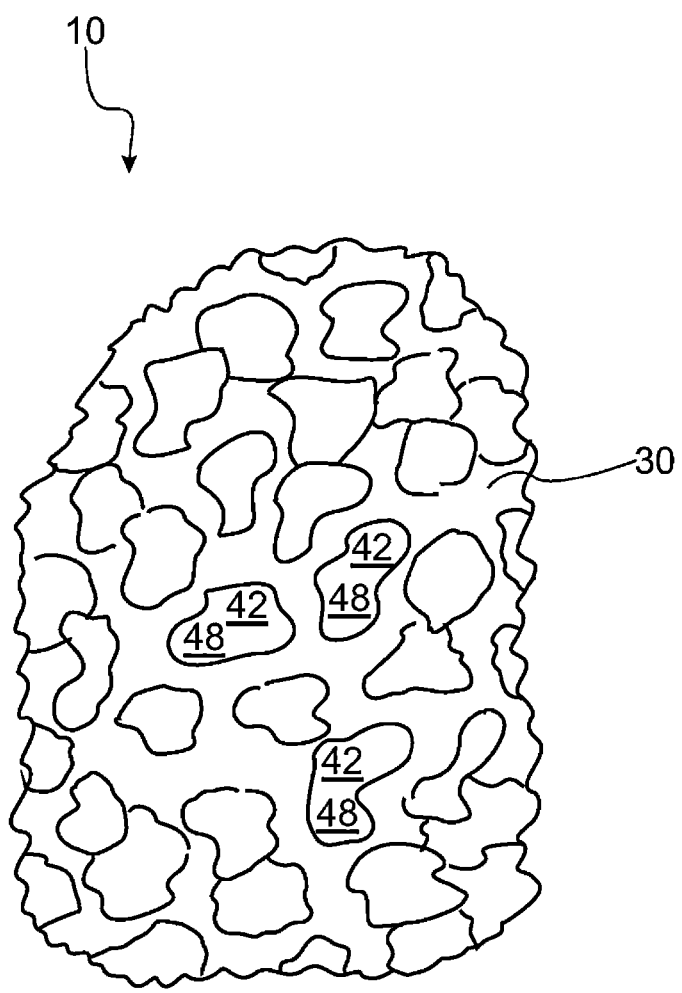

FIG. 3: a damping film according to a second embodiment in a sectional view in a detail view.

In the following description, the same reference signs denote the same components or features; in the interest of avoiding repetition, a description of a component made with reference to one drawing also applies to the other drawings. Furthermore, individual features that have been described in connection with one embodiment can also be used separately in other embodiments.

The damping film 10 in FIG. 1 consists substantially of a first carrier layer 20, a first adhesion layer 30, a damping layer 40, a second adhesion layer 50 and a second carrier layer 60.

The first adhesion layer 30 is in contact with the first carrier layer 20 and the damping layer 40 and connects them to each other.

The second adhesion layer 50 is in contact with the second carrier layer 60 and the damping layer 40 and connects them to each other.

The damping layer 40 comprises a layer 44 of a damping material 42, in particular a damping material 42 comprising a magnetically soft substance.

The damping material 42 is organized in strips 46 in the layer 44 of the damping layer 40, wherein the strips 46 are arranged parallel to each other and adjacent strips 46 have a distance 47 from each other.

FIG. 2 shows a sectional view of the embodiment of the damping film 10 from FIG. 1, wherein the section extends through the damping layer (not denoted) and thus allows for a plan view of the strips 46 in the damping layer 40.

The damping film 10 in FIG. 3 is shown in a sectional view of a detail view, wherein the section extends through the damping layer (not denoted). The damping layer (not denoted) comprises the damping material 42 in the form of particles 48.

The particles 48 do not form a continuous damping layer (not denoted), but have irregular gaps (not denoted) relative to each other, so that the first adhesion layer 30 is shown through these irregular gaps.

LIST OF REFERENCE SIGNS

10 Damping film
20 First carrier layer
30 First adhesion layer
40 Damping layer
42 Damping material
44 Layer
46 Strip
47 Distance
48 Particles
50 Second adhesion layer
60 Second carrier layer

The invention claimed is:

1. A damping film for shielding an electronic device from an electrical and/or magnetic field comprising:
   a first carrier layer;
   a first adhesion layer which is in direct contact with the first carrier layer;

a damping layer which is in direct contact with the first adhesion layer, wherein the damping layer comprises a damping material consisting of a magnetically soft substance;

a second adhesion layer which is in direct contact with the damping layer; and a second carrier layer which is in direct contact with the second adhesion layer, wherein the damping material has a coercivity of less than or equal to 2 A/m.

2. The damping film according to claim 1, wherein the damping material of the damping layer projecting in the normal direction of the first carrier layer has a cross-sectional area of more than or equal to 80% of the cross-sectional area of the first carrier layer.

3. The damping film according to claim 1, wherein the damping layer comprises a layer of several strips of the damping material.

4. The damping film according to claim 3, wherein two strips of the damping material have a distance of less than or equal to 0.2 mm from each other.

5. The damping film according to claim 3, wherein two strips of the damping material overlap by more than or equal to 0.2 mm.

6. The damping film according to claim 1, wherein the damping layer comprises particles of the damping material.

7. The damping film according to claim 6, wherein the particles have an extension in a range of greater than or equal to 3 μm and less than or equal to 200 μm.

8. The damping film according to claim 1, wherein the damping film has a third adhesion layer.

9. The damping film according to claim 1, wherein the first carrier layer and/or the second carrier layer and/or the first adhesion layer and/or the second adhesion layer and/or the third adhesion layer has a temperature resistance of more than or equal to 80° C.

10. The damping film according to claim 1, wherein the damping material has a remanence of less than or equal to 0.1 T.

11. The damping film according to claim 1, wherein the damping material has a saturation flux density of greater than or equal to 1 T.

12. The damping film according to claim 1, wherein the magnetically soft substance is a metallic glass.

13. The damping film according to claim 12, wherein the magnetically soft substance has a nanocrystalline structure.

14. The damping film according to claim 1, wherein the magnetically soft substance has the following atomic composition:

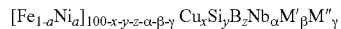

where $a \leq 0.3$, $0.6 \leq x \leq 1.5$, $10 \leq y \leq 17$, $5 \leq z \leq 14$, $2 \leq a \leq 6$, $\beta \leq 7$, and $\gamma \leq 8$, wherein M' is at least one of the elements V, Cr, Co, Al and Zn, wherein M" is at least one of the elements C, Ge, P, Ga, Sb, In and Be.

15. The damping film according to claim 1, wherein the magnetically soft substance has a magnetostriction with a relative change in length in terms of magnitude parallel to the magnetic field of less than or equal to 2 times $10^{-6}$.

16. An item comprising a battery, a receiver coil for wirelessly receiving energy, and a damping film according to claim 1.

17. The item according to claim 16, wherein the damping film is disposed between the battery and the receiver coil.

18. An item comprising a transmitter coil for wirelessly transmitting energy to a receiver coil, and a damping film according to claim 1.

19. The item according to claim 18, wherein the damping film is disposed on the transmitter coil.

20. A process for producing a damping film, comprising the following:

providing a first carrier layer and a first adhesion layer;

contacting the first carrier layer and the first adhesion layer;

providing a damping material consisting of a magnetically soft substance;

contacting the damping material with the first adhesion layer to form a damping layer connected to the first carrier layer;

providing a second adhesion layer and a second carrier layer;

contacting the second carrier layer and the second adhesion layer; and contacting the second adhesion layer with the damping layer to form a damping film according to claim 1.

21. A use of a damping film according to claim 1 in an item having components for wireless charging.

22. The use of a damping film according to claim 1 in an item having components to be shielded.

* * * * *